US008837209B2

(12) United States Patent
Ohno et al.

(10) Patent No.: US 8,837,209 B2
(45) Date of Patent: Sep. 16, 2014

(54) MAGNETIC MEMORY CELL AND MAGNETIC RANDOM ACCESS MEMORY

(75) Inventors: Hideo Ohno, Sendai (JP); Shoji Ikeda, Sendai (JP); Katsuya Miura, Higashimurayama (JP); Kazuo Ono, Hachioji (JP); Riichiro Takemura, Tokyo (JP); Hiromasa Takahashi, Hachioji (JP)

(73) Assignees: Hitachi, Ltd., Tokyo (JP); Tohoku University, Sendai-shi, Miyagi (JP)

( * ) Notice: Subject to any disclaimer, the term of this patent is extended or adjusted under 35 U.S.C. 154(b) by 190 days.

(21) Appl. No.: 13/582,955

(22) PCT Filed: Feb. 17, 2011

(86) PCT No.: PCT/JP2011/053324
§ 371 (c)(1),
(2), (4) Date: Nov. 19, 2012

(87) PCT Pub. No.: WO2011/108359
PCT Pub. Date: Sep. 9, 2011

(65) Prior Publication Data
US 2013/0058156 A1    Mar. 7, 2013

(30) Foreign Application Priority Data

Mar. 5, 2010  (JP) .................................. 2010-049562

(51) Int. Cl.
*G11C 11/00* (2006.01)
*H01L 43/08* (2006.01)
*H01L 27/22* (2006.01)
*G11C 11/16* (2006.01)

(52) U.S. Cl.
CPC ................ *H01L 43/08* (2013.01); *G11C 11/00* (2013.01); *H01L 27/228* (2013.01); *G11C 11/1659* (2013.01); *G11C 11/161* (2013.01); *G11C 11/1675* (2013.01); *Y10S 977/935* (2013.01)
USPC ............ 365/158; 365/148; 365/171; 977/935

(58) Field of Classification Search
CPC ....................................................... G11C 11/00
USPC ......... 365/48, 55, 62, 66, 74, 78, 80–93, 100, 365/130, 131, 148, 158, 171–173, 225.5, 365/243.5; 257/421, E21.665; 438/3; 977/933–935
See application file for complete search history.

(56) References Cited

U.S. PATENT DOCUMENTS 7,714,399 B2 * 5/2010 Morise et al. .................. 257/421
7,936,595 B2 * 5/2011 Han et al. ...................... 365/171
(Continued)

FOREIGN PATENT DOCUMENTS

JP    2001-250206 A    9/2001
JP    2002-305337 A    10/2002
(Continued)

*Primary Examiner* — Harry W Bryne
(74) *Attorney, Agent, or Firm* — Miles & Stockbridge P.C.

(57) ABSTRACT

A relation between a drive current of a selection transistor of a magnetic memory and a threshold magnetization switching current of the magnetoresistance effect element is optimized. In order to optimize the relation between the drive current of the selection transistor and the threshold magnetization switching current of the magnetoresistance effect element 101 of the magnetic memory cell, a mechanism 601-604 for dropping the threshold magnetization switching current on "1" writing is provided that applies a magnetic field that is in the inverse direction of the pinned layer to the recording layer of the magnetoresistance effect element.

20 Claims, 15 Drawing Sheets

(56) References Cited

U.S. PATENT DOCUMENTS

| | | |
|---|---|---|
| 2001/0025978 A1 | 10/2001 | Nakao |
| 2002/0105827 A1 | 8/2002 | Redon et al. |
| 2007/0097736 A1 | 5/2007 | Inokuchi et al. |
| 2008/0197431 A1* | 8/2008 | Morise et al. ............. 257/421 |
| 2009/0168506 A1* | 7/2009 | Han et al. ................ 365/171 |
| 2011/0267879 A1* | 11/2011 | Nagahara et al. .......... 365/171 |
| 2012/0268986 A1* | 10/2012 | Ogimoto ................... 365/173 |

FOREIGN PATENT DOCUMENTS

| | | |
|---|---|---|
| JP | 2005-277147 A | 10/2005 |
| JP | 2007-123637 A | 5/2007 |

* cited by examiner

US 8,837,209 B2

MAGNETIC MEMORY CELL AND MAGNETIC RANDOM ACCESS MEMORY

TECHNICAL FIELD

The present invention relates to a magnetic memory cell and a magnetic random access memory comprising a magnetoresistance effect element.

BACKGROUND ART

FIG. 1 is a conceptual diagram of a magnetic memory cell in a magnetic random access memory (MRAM). Magnetic memory cell 100 has a structure in which a magnetoresistance effect element 101 and a selection transistor 102 are electrically connected in series. A source electrode of the selection transistor 102 is electrically connected to a source line 103, a drain electrode is electrically connected to bit lines 104 via the magnetoresistance effect element 101, and a gate electrode is connected to word lines 105, respectively. The magnetoresistance effect element 101 has a base structure comprising 3 layers in which a nonmagnetic layer 108 is sandwiched between two ferromagnetic layers 106, 107. For example, the first ferromagnetic layer 106 is a pinned layer whose magnetization direction is pinned. A second ferromagnetic layer 107 is a recording layer whose magnetization direction is variable. The magnetoresistance effect element 101 has a low resistance when the magnetization directions of the two ferromagnetic layers 106, 107 are in parallel with each other (P state). The magnetoresistance effect element 101 has a high resistance when the magnetization directions of the two ferromagnetic layers 106, 107 are in antiparallel with each other (AP state). In MRAM, this change of resistance is associated with bit information of "0" and "1". Bit information is written by spin-transfer torque magnetization switching by current flowing through the magnetoresistance effect element 101. When a current flows from the pinned layer to the recording layer, magnetization of the recording layer becomes antiparallel with the magnetization of the pinned layer, and bit information becomes "1". When a current flows from the recording layer to the pinned layer, the magnetization of the recording layer becomes parallel with the magnetization of the pinned layer, and the bit information becomes "0". Since the velocity of the magnetization switching by the current is 1 nanosecond or so, MRAM can perform writing with extremely high speed. Further, because MRAM records bit information according to the magnetization direction of the recording layer, MRAM has non-volatility, and can suppress stand-by power consumption. Therefore, MRAM is expected as a next generation memory. Further, even a magnetoresistance effect element in which the positional relation between the pinned layer and the recording layer is switched so that the upper layer is the pinned layer and the lower layer is the recording layer, serves as an MRAM in the same way.

CITATION LIST

Patent Literature

Patent Literature 1: JP 2002-305337 A

SUMMARY OF INVENTION

Technical Problem

The problem that the magnetic memory cell has is explained with the case where, as shown in FIG. 1, on the transistor side of the magnetoresistance effect element 101 is provided the pinned layer 106, and on the bit line side is provided the recording layer 107.

FIG. 2A and FIG. 2B are conceptual diagrams showing in the voltage applied to the magnetic memory cell. In the "0" writing operation of MRAM, as shown in FIG. 2A, a voltage is applied to bit lines 104 of the magnetic memory cell in which writing is performed, and the electric potential of the source line 103 is set 0. Or, the bit lines 104 are set at a high electric potential, and the source line 103 is set at a low electric potential with respect to the bit lines 104. Here, a case where the electric potential of the source line 103 is set 0 is explained as an example. In this state, when a voltage is applied to the word lines 105, a current $I_{w,AP \to P}$ flows through the source line 103 from the bit lines 104 via a magnetoresistance effect element and selection transistor. Where the voltage applied to the bit lines 104 is $V_w$, and the voltage applied to the word line is $V_g$, the magnitude of the current that can be flown to the magnetic memory cell is as follows:

$$I_{w,AP \to P} = \frac{V_w}{R_{TR} + R_{MTJ}}$$

Here, $R_{TR}$ and $R_{MTJ}$ represent respectively the resistance value of the selection transistor and the resistance value of the magnetoresistance effect element. In "1" writing operation, as shown in FIG. 2B, a voltage $V_w$ is applied to the source lines 103 of the magnetic memory cell on which writing is performed, the electric potential of the bit lines 104 is set 0, and the voltage $V_g$ is applied to the word lines 105. When the voltage applied to the source lines 103 is $V_w$, the current $I_{w,P \to AP}$ flows from the source lines 103 to the bit lines 104. In this time, a voltage $V_d$ (electric potential of the drain electrode) is applied to the selection transistor, and a voltage $V_{MTJ}$ is applied to the magnetoresistance effect element.

$$V_d = V_w \times \frac{R_{TR}}{R_{MTJ} + R_{TR}}$$

$$V_{MTJ} = V_w \times \frac{R_{MTJ}}{R_{MTJ} + R_{TR}}$$

Accordingly, the voltage effectively applied to the gate electrode is $V_g$-$V_d$. FIG. 3 is a diagram showing the relation between the source-drain current and the gate voltage of the selection transistor in the magnetic memory cell. When the characteristics of the source-drain current and the gate voltage of the selection transistor are as shown in FIG. 3, the following expression establishes:

$$I_{w,P \to AP} = I_{w,AP \to P} \times \frac{V_g - V_d}{V_w}$$

(The above is so-called source follower state). Therefore, as shown in FIG. 3, the drive current of the selection transistor 102, "1" writing current $I_{w,P \to AP}$ decreases with respect to the "0" writing current $I_{w,AP \to P}$. As an example, $V_w$=$V_g$=1.8V, $R_{MTJ}$=$R_{TR}$=1 kΩ and the change ratio in resistance of the magnetoresistance effect element is assumed to be 100%. In this state, $I_{w,AP \to P}$ is 0.9 mA. However, in the case of $I_{w,AP \to P}$, the value of $R_{MTJ}$ is 2 kΩ in the AP state, there are many cases where effective resistance becomes low at an actual operating voltage. In particular, where the nonmagnetic layer 108 is an insulating material, the resistance in the AP state becomes markedly low when the voltage becomes large. Therefore, $V_g=1V$ or so, and in the characteristics of the selection transistor 102 as shown in FIG. 3, $I_{w,AP \to P}$ is 0.45 mA or so, which is approximately the half of $I_{w,AP \to P}$.

On the other hand, the threshold magnetization switching current of the recording layer of the magnetoresistance effect element depends on the amount $g(\theta)=P/2(1+P^2 \cos \theta)$ that represents efficiency of electron spin that provides magnetization switching torque. Here, $\theta$ is a relative angle between the pinned layer magnetization and the recording layer magnetization of the magnetoresistance effect element, $\theta=0$ in P state, $\theta=\pi$ in AP state. Further, P is spin polarizability. Therefore, the relation of the threshold current $I_{c,P \to AP}$ necessary for "0" writing and the threshold current $I_{c,AP \to P}$ necessary for "1" writing becomes $I_{c,P \to AP} \approx I_{c,AP \to P} \times g(0)/g(\pi)$, and $I_{c,P \to AP}$ becomes large as compared to $I_{c,AP \to P}$. That is, as a common example, where $I_{c,AP \to P}=2\times 10^6$ A/cm$^2$, $I_{c,P \to AP}$ becomes 1.5 times to twice larger or so, $3\times 10^6$ A/cm$^2$ or greater.

FIG. 4A shows the relation between the threshold magnetization switching current of the recording layer of the magnetoresistance effect element and the drive current of the selection transistor. The magnetization switching does not occur unless the threshold magnetization switching current is smaller than the drive current of the selection transistor 102. However, as understood from FIG. 4A, in the magnetic memory cell of this configuration it becomes difficult to meet these conditions in writing from the P state to the AP state because of the above-stated reason. That is, in order to perform writing, although it is necessary to satisfy the conditions of $I_{w,AP \to P}>I_{c,AP \to P}$, $I_{w,P \to AP}>I_{c,P \to AP}$, actually it becomes that $I_{w,P \to AP}<I_{c,P \to AP}$. Therefore, it is demanded to reduce $I_{c,P \to AP}$. For this purpose, it suffices if the state of FIG. 4B is achieved.

In the case where the magnetoresistance effect element is prepared by using a perpendicular magnetic anisotropy material, the magnetization of the pinned layer 106 and the magnetization of the recording layer 107 become unstable in the antiparallel disposition. This is because a repulsive force works because magnetic pole of the pinned layer 106 and the recording layer 107 having the same polarity come close to each other. Therefore, the difference between $I_{c,P \to AP}$ and $I_{c,AP \to P}$ of the magnetoresistance effect element using perpendicular magnetic anisotropy material becomes larger than the case of the magnetoresistance effect element using in-plane magnetic anisotropy. Therefore, further reduction of $I_{c,P \to AP}$ will be necessary.

Solution to Problem

The magnetic memory cell of the present invention comprises magnetoresistance effect element comprising a first ferromagnetic layer; a second ferromagnetic layer; a nonmagnetic layer formed between the first ferromagnetic layer and the second ferromagnetic layer, a selection transistor; and a mechanism that applies a voltage in series to the magnetoresistance effect element and the above selection transistor. One of the first ferromagnetic layer and the second ferromagnetic layer is a pinned layer whose magnetization direction is pinned and the other is a recording layer whose magnetization direction is variable. A drain electrode of the selection transistor is electrically connected with the first ferromagnetic layer. The magnetoresistance effect element is placed in a first resistance value state when a current exceeding the first threshold current flows from the first ferromagnetic layer to the second ferromagnetic layer, and placed in a second resistance value state when a current exceeding the second threshold current flows from the second ferromagnetic layer to the first ferromagnetic layer.

Here is provided a magnetic field application mechanism that applies an effective magnetic field $H_{ex}$ that is in inverse direction of the magnetization direction of the pinned layer to the recording layer, in accordance with reduction of the drive current of the selection transistor in applying a voltage thereto so as to flow a current from the first ferromagnetic layer to the second ferromagnetic layer as compared to that in applying a voltage so as to flow a current from the second ferromagnetic layer to the first ferromagnetic layer and in order to decrease the first threshold current on flowing a current from the first ferromagnetic layer to the second ferromagnetic layer to be equal to or less than the drive current of the selection transistor.

When the magnetoresistance effect element has an in-plane magnetic anisotropy, there are many cases where the magnetoresistance effect element imparts shape magnetic anisotropy by oblong or elliptical shape. In this case, an effective magnetic field $H_{ex}$ is applied to the longitudinal direction of the magnetoresistance effect element.

The conditions that the effective magnetic field $H_{ex}$ should satisfy are described hereinafter. The value of $I_{c,P \to AP}$ on application of the effective magnetic field $H_{ex}$ to the recording layer of the magnetoresistance effect element is represented as the expression below. The direction of application of an effective magnetic field $H_{ex}$ is in inverse direction of the magnetization direction of the pinned layer.

$$I_{c,P \to AP} = I_{c0,P \to AP}\left[1 - \frac{k_B T}{E\left(1-\frac{H_{ex}}{H_k}\right)^2}\ln\frac{t_p}{t_0}\right]$$

Here, $I_{c0,P \to AP}$ is a writing current on "1" writing with the writing time of 1 nanosecond, $k_B$ is Boltzmann constant, T is temperature, E is potential barrier between the P state and the AP state where there is no external magnetic field, $H_k$ is anisotropy magnetic field of the recording layer, $t_p$ is a writing time, $t_0$ is a attempt time, which is approximately assumed to be 1 nanosecond.

From the conditions of $I_{w,P \to AP}>I_{c,P \to AP}$, the effective magnetic field $H_{ex}$ to be applied is the expression below. On the other hand, $I_{c,AP \to P}$ in this time is represented by the following expression and slightly increases. $I_{c0,AP \to P}$ is a writing current on "0" writing with a writing time of 1 nanosecond.

$$H_{ex} > H_k\left\{\left[\left(1-\frac{I_{w,P \to AP}}{I_{c0,P \to AP}}\right)\frac{E}{k_B T}\ln\left(\frac{t_p}{t_0}\right)\right]^{\frac{1}{2}} - 1\right\}$$

$$I_{c,AP \to P} = I_{c0,AP \to P}\left[1 - \frac{k_B T}{E\left(1-\frac{H_{ex}}{H_k}\right)^2}\ln\frac{t_p}{t_0}\right]$$

Therefore, from the condition of $I_{w,AP \to P}>I_{c,AP \to P}$, the effective magnetic field $H_{ex}$ to be applied is:

$$H_{ex} < H_k\left\{1-\left[\left(1-\frac{I_{w,AP \to P}}{I_{c0,AP \to P}}\right)\frac{E}{k_B T}\ln\left(\frac{t_p}{t_0}\right)\right]^{\frac{1}{2}}\right\}$$

Considering distribution of properties, of the anisotropy magnetic field $H_k$ and $I_{c0}$ or the like of the recording layer of the magnetoresistance effect element and distribution of properties of the selection transistor, designs may have a sufficient margin with the magnetic field in the proximity of the above-stated conditions of the effective magnetic field as a central value.

Further, in FIG. 1, where the pinned layer 106 is positioned on the side of the bit lines 104, and the recording layer 107 is positioned on the side of the selection transistor 102, since a current direction that causes magnetization switching of P→AP and AP→P becomes inverse, the relation between the current that the selection transistor can supply and the threshold current of the magnetoresistance effect element becomes as shown in FIG. 4C, a case may be considered where the conditions of $I_{w,AP \to P} > I_{c,AP \to P}$, $I_{w,P \to AP} > I_{c,P \to AP}$ are satisfied. In this case, the above-stated magnetic field is not always necessary. However, also in this case, depending on conditions including the size of the magnetoresistance effect element and the size of the selection transistor, the relation becomes as shown in FIG. 4D, and the application of the magnetic field works effectively for writing. Also in this case, the conditions of the effective magnetic field $H_{ex}$ can be represented by the above-stated expression. However, it is anticipated that the actually applied magnetic field would be smaller.

Further, the characteristic of the present invention is, unlike the conventional techniques, that it is not necessary to change the direction of magnetic field to be applied according to information to be written, "0" or "1". In conventional techniques, magnetic field of the same direction as the magnetization direction of the pinned layer is applied on "0" writing, and a magnetic field of inverse direction of the magnetization direction of the pinned layer is applied on "1" writing. This method is effective for decreasing the threshold magnetization switching current. However, in order to control the magnetic field direction, wiring, etc. for magnetic field application is newly needed, and a circuit is also needed that controls a current direction of a current flowing on the wiring for magnetic field application. In the present invention, the magnetic field direction always keeps the same direction, so that such a wiring or circuit is not always necessary.

Further, since the read operation of MRAM reads out a resistance value of the magnetoresistance effect element that is bit information, voltage application is stopped from the state where the voltage is applied to the magnetoresistance effect element. When the voltage application is stopped, the voltage level of the magnetoresistance effect element gradually decays. However the decaying speed depends on the resistance value. Accordingly, in order for the difference of voltage levels that is sufficient for distinguishing between "0" state and "1" state to be generated, a certain duration of time is necessary. It is preferable that in this time duration, the voltage applied to the magnetoresistance effect element is large. However, if the voltage is too large, since a current of the threshold magnetization switching current or greater flows, a write error is caused. Where the effective magnetic field $H_{ex}$ is applied, as understood from FIG. 4B, since the "0" writing current becomes large, it is possible to reduce the probability of write errors when a voltage is applied to the bit lines 104 so that "0" writing direction current flows on readout.

Further, MRAM of the present invention is a magnetic random access memory comprising a sub array comprising: a plurality of bit lines arranged in parallel with each other; a plurality of source lines arranged in parallel with the bit lines; a plurality of word lines crossing the bit lines and arranged in parallel with each other; a plurality of magnetic memory cells disposed at a part in which the bit lines and the word lines cross, wherein the magnetic memory cell is the magnetic memory cell according to the above. The bit lines are electrically connected to the second ferromagnetic layer, the source lines are electrically connected to the source electrode of the selection transistor, and the word lines are electrically connected to the gate electrode of the selection transistor.

Advantageous Effects of Invention

According to the present invention, by applying an effective magnetic field that satisfies the conditions, in a magnetic memory cell of MRAM, stable operation becomes possible in both "0" writing and "1" writing. Further, although the supply current of the transistor becomes small in accordance with miniaturization, it becomes possible to address the miniaturization by optimizing the conditions of the effective magnetic field.

DESCRIPTION OF EMBODIMENTS

Hereinafter, a magnetic memory cell and magnetic random access memory (MRAM) in which the present invention is applied is explained in detail with reference to the drawings.
<Embodiment 1>

Figure 5:
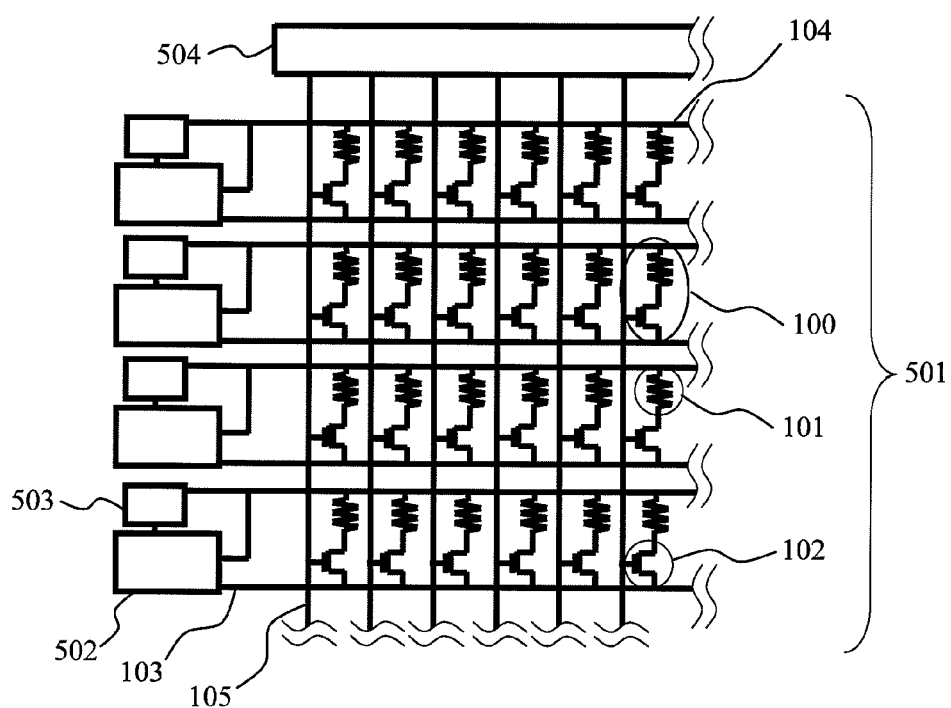
FIG. 5 is a schematic diagram showing one example of MRAM according to the present invention.

FIG. 5 is a schematic diagram showing one example of MRAM according to the present invention. MRAM according to the present embodiment comprises a plurality of bit lines 104 disposed in parallel with each other and a plurality of the source lines 103 disposed in parallel with each other and in parallel with the bit lines 104, and a plurality of word lines 105 disposed perpendicularly to the bit lines 104 and in parallel with each other, and a magnetic memory cell 100 is disposed at each point of intersection of the bit lines 104 and the word lines 105. The magnetic memory cell 100 comprises the magnetoresistance effect element 101 and the selection transistor 102. The plurality of magnetic memory cells constitute the sub arrays 501, and MRAM is constituted of a plurality of sub arrays 501. The magnetoresistance effect element 101 comprises a structure shown in FIG. 1, and the pinned layer 106 is electrically connected to the drain electrode of the selection transistor 102 via a wiring layer. The recording layer 107 is electrically connected to the bit lines 104, and the source lines 103 are electrically connected to the source electrode of the selection transistor 102 via the wiring layer. Further, the word lines 105 are electrically connected to a gate electrode of the selection transistor 102. Respective one ends of the source lines 103 and the bit lines 104 are electrically connected to a writing driver 502 for voltage application and a sense amplifier 503. One end of the word lines 105 is electrically connected to the word driver 504.

Figure 6A:
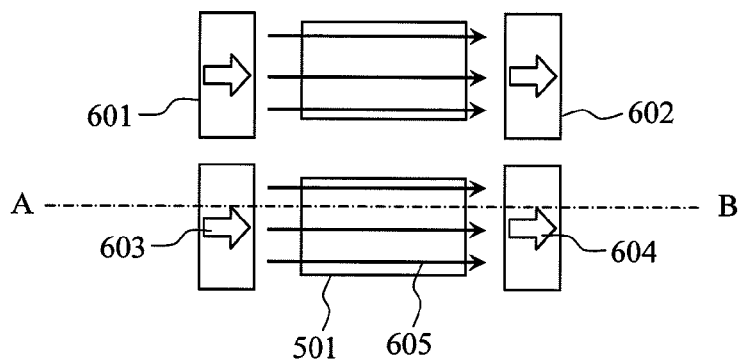
FIG. 6A is a planar schematic diagram of a sub array of MRAM.
Figure 6B:
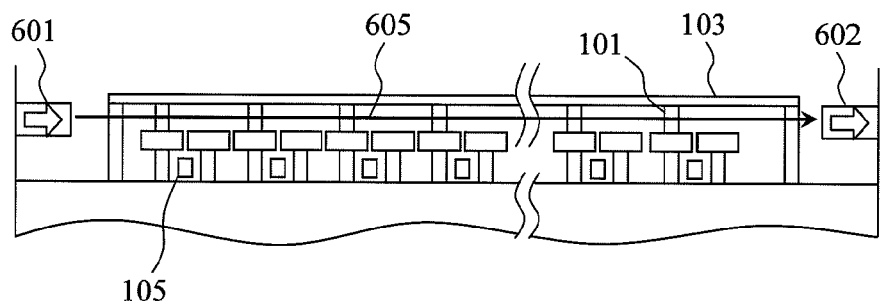
FIG. 6B is a cross-sectional diagram of FIG. 6A taken along the line A-B.

Further, as shown in the planar schematic diagram of FIG. 6A, ferromagnetic layers 601, 602 are provided as mechanisms to apply the effective magnetic field $H_{ex}$ to the recording layer of the magnetic memory cell. FIG. 6B is a cross-sectional diagram of FIG. 6A taken along the line A-B. The ferromagnetic layers 601, 602 are disposed on the same layer as the magnetoresistance effect element 101 in the manner of sandwiching sub arrays 501 as shown in FIG. 6B.

Figure 1:
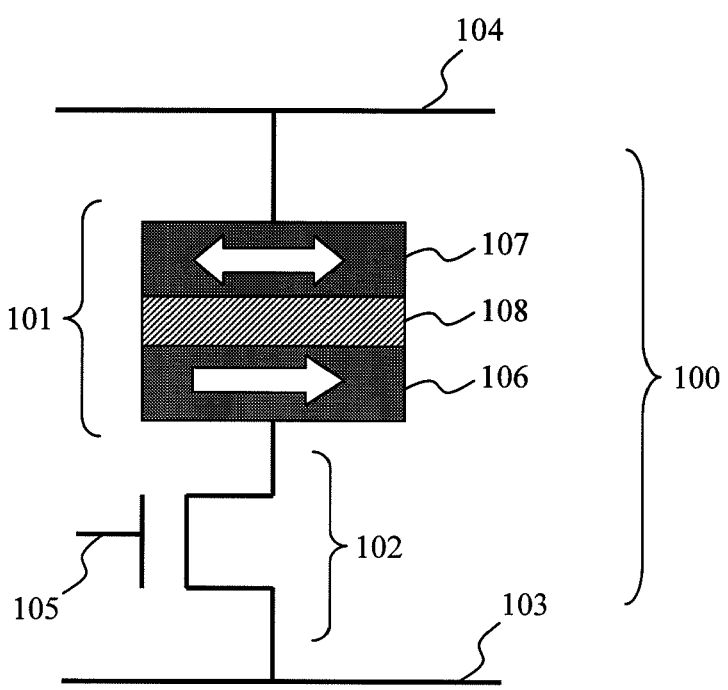
FIG. 1 is a conceptual diagram of a magnetic memory cell.
Figure 2A:
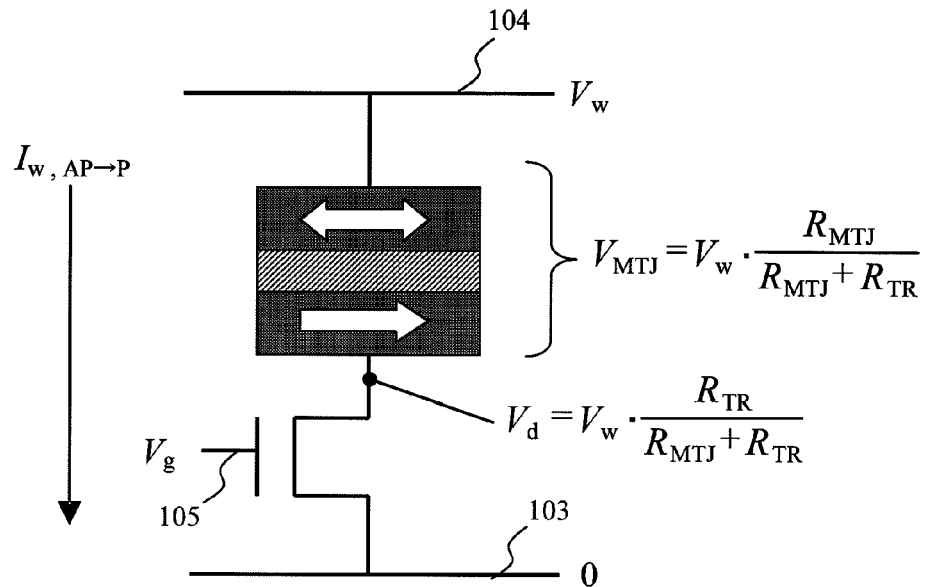
FIG. 2A is a conceptual diagram showing a voltage applied to the magnetic memory cell.
Figure 2B:
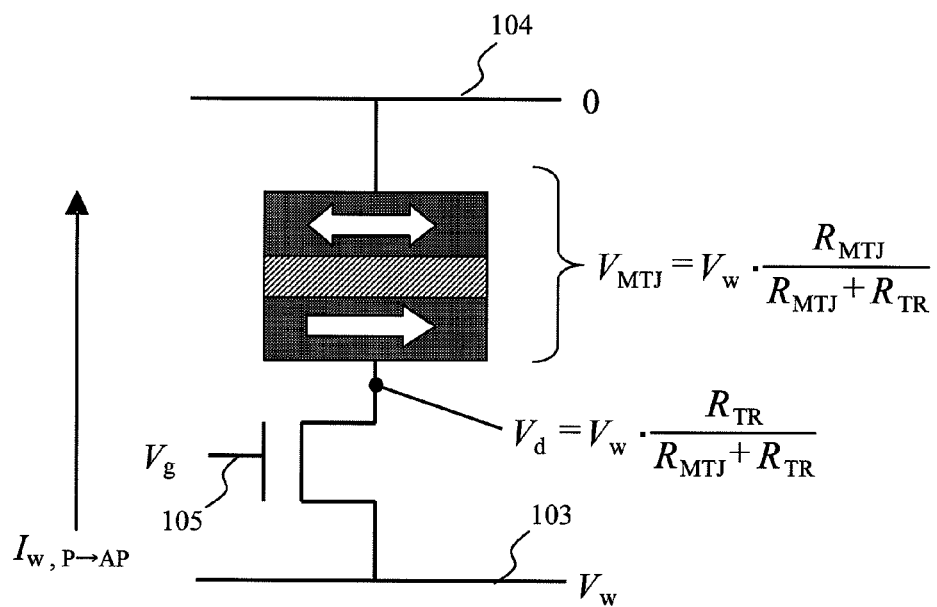
FIG. 2B is a conceptual diagram showing a voltage applied to the magnetic memory cell.
Figure 3:
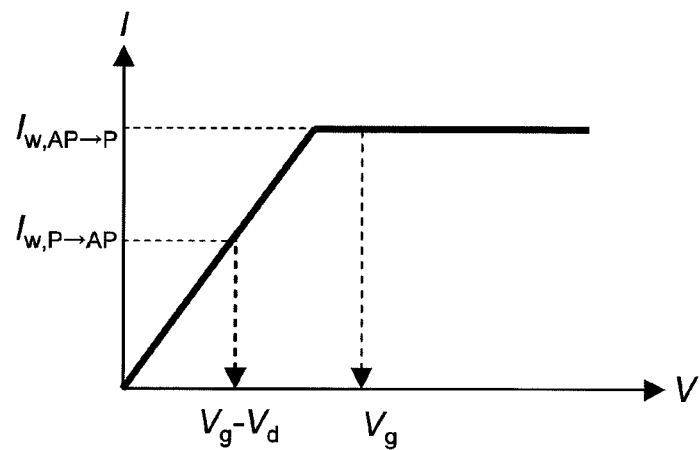
FIG. 3 is a diagram showing a relation between a source-drain current and a gate voltage of the selection transistor.

The following explains a case where the pinned layer 106 and the recording layer 107 of the magnetoresistance effect element 101 are positioned in the manner as shown in FIG. 1 and magnetization 603 of the ferromagnetic layer 601 and magnetization 604 of the ferromagnetic layer 602 are magnetized in the direction indicated by the arrow. As indicated by the arrow depicted by a continuous line in FIG. 6A and FIG. 6B, the magnetic flux 605 is generated from the ferromagnetic layer 601 toward the ferromagnetic layer 602. The magnitude of the magnetic field is adjusted to be effective magnetic field $H_{ex}$ at the position of the recording layer of the magnetoresistance effect element. By disposing a plurality of sub arrays 501 configured in this way, the storage holding area of MRAM is configured.

As the materials for the pinned layer and the recording layer of magnetoresistance effect element, all ferromagnetic metals are applicable. As the material for nonmagnetic layer sandwiched between the pinned layer and the recording layer, all non-magnetic materials are applicable. Further, a nonmagnetic layer is formed of an insulating film. In the case where the nonmagnetic layer is formed of an insulating film, a change ratio in resistance between the P state and the AP state becomes large as compared to the case where the nonmagnetic layer is formed of a non-magnetic metal. As a material of the insulating film, all insulating materials are applicable. However, materials having a large change ratio in resistance are preferable, examples of the materials of the insulating film include MgO. It is known, in the case where MgO is applied as the insulating film, change ratio in resistance becomes large when Fe, CoFe, CoFeB, etc. are employed as the material of the pinned layer 106 and the recording layer 107. As the material of the ferromagnetic layers 601, 602, all ferromagnetic metals are applicable. However, it is desirable to use a hard magnetic material for stably generating a uniform effective magnetic field $H_{ex}$.

In MRAM according to the present embodiment, magnetization direction of the ferromagnetic layer 601 and the magnetization direction of the ferromagnetic layer 602 need to be in inverse direction of the magnetization direction of the pinned layer 106 of the magnetoresistance effect element 101. In order to control the magnetization direction, the anisotropy magnetic field $H_k$ of the pinned layer 106, the recording layer 107, the ferromagnetic layer 601 and the ferromagnetic layer 602, are designed so that the magnitude is different in the relation of the ferromagnetic layer 601=the ferromagnetic layer 602>the pinned layer>the recording layer. In the first thermal treatment process, thermal treatment is performed by applying a magnetic field stronger than the anisotropy magnetic field of the ferromagnetic layers 601, 602 in the magnetic easy axes direction of the pinned layer and the recording layer of the magnetoresistance effect element, to magnetize the magnetization of the pinned layer and the ferromagnetic layers 601, 602. Thereafter, in the second thermal treatment process, a magnetic field that is smaller than the anisotropy magnetic field of the ferromagnetic layers 601, 602 and greater than the anisotropy magnetic field of the pinned layer is applied in the direction inverse to the first thermal treatment process, and the magnetization of the pinned layer is magnetized. Through these processes, it is possible to control the magnetization direction.

Further, the case has been described in which the magnetization 603 of the ferromagnetic layer 601 and the magnetization 604 of the ferromagnetic layer 602 are magnetized in the direction indicated by the arrow in FIG. 6A. However, direction of the magnetization 603 of the ferromagnetic layer 601 and direction of magnetization 604 of the ferromagnetic layer 602 are not limited if only the condition that the directions thereof are in the magnetic easy axes direction of the magnetoresistance effect element 101 and in the inverse direction of the magnetization of the pinned layer 106.

Figure 6C:
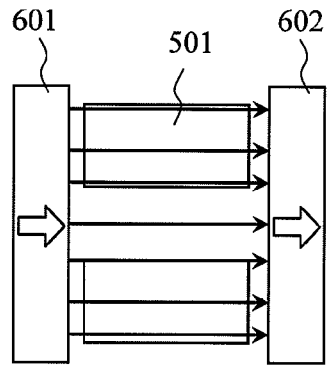
FIG. 6C is a planar schematic diagram of a sub array of MRAM.
Figure 6D:
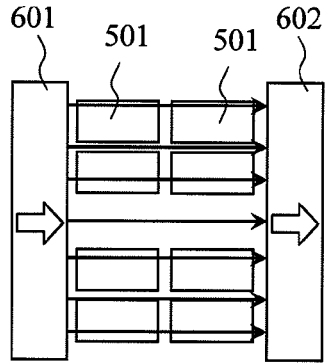
FIG. 6D is a planar schematic diagram of a sub array of MRAM.

As shown in the planar schematic diagrams of FIG. 6C and FIG. 6D, there may be provided a plurality of sub arrays 501 sandwiched between a pair of ferromagnetic layer 601 and the ferromagnetic layer 602.

<Embodiment 2>

Figure 7:
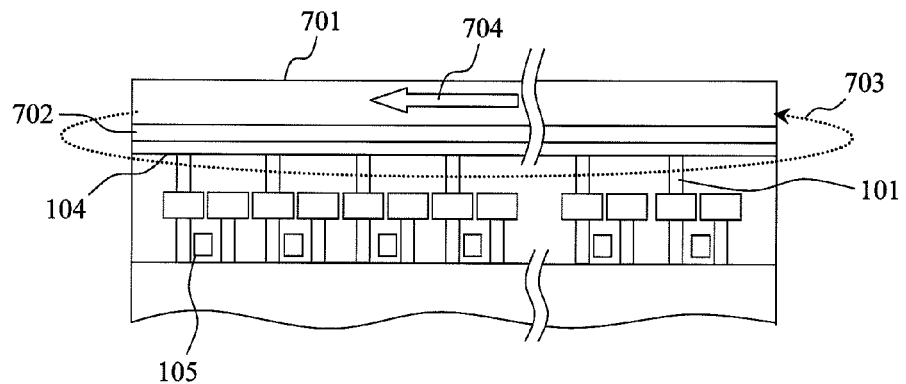
FIG. 7 is a cross-sectional schematic diagram showing one example of MRAM according to the present invention.

The ferromagnetic layer that generates the effective magnetic field $H_{ex}$ may be provided above the magnetic memory cell. FIG. 7 is a cross-sectional schematic diagram showing an embodiment of MRAM in which the ferromagnetic layer 701 is disposed above the sub arrays 501.

In the case of the present embodiment, the ferromagnetic layer 701 is formed on the interlayer insulating layer 702 laminated on the magnetoresistance effect element 101 and the bit lines 104. The magnetic flux 703 is generated from the ferromagnetic layer 701 and the magnetic field is applied in the direction indicated by the dotted line arrow to the magnetoresistance effect element 101. The magnitude of the magnetic field is adjusted to be the effective magnetic field $H_{ex}$ at the position of the recording layer in the magnetoresistance effect element. In this structure, the magnetization 704 of the ferromagnetic layer 701 is designed to be in the same direction as the magnetization of the pinned layer 106. Therefore, since it suffices that thermal treatment is performed one time in the present embodiment, it is possible to simplify the memory preparation process.

Although the case where the magnetization 704 of the ferromagnetic layer 701 is magnetized in the direction indicated by the arrow in FIG. 7 has been described, the direction of the magnetization 704 of the ferromagnetic layer 701 is not limited if only the conditions that the direction is the magnetic easy axes direction of the magnetoresistance effect element and the same direction as the magnetization of the pinned layer 106 are satisfied.

<Embodiment 3>

Figure 8A:
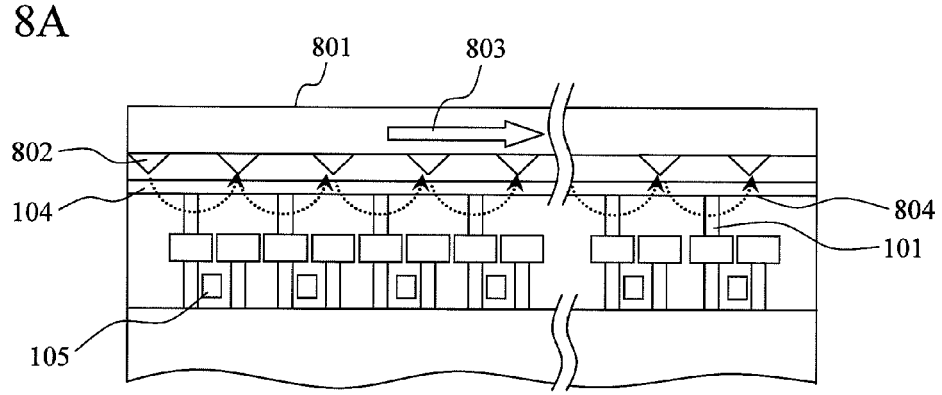
FIG. 8A is a cross-sectional schematic diagram showing one example of MRAM according to the present invention.
Figure 8B:
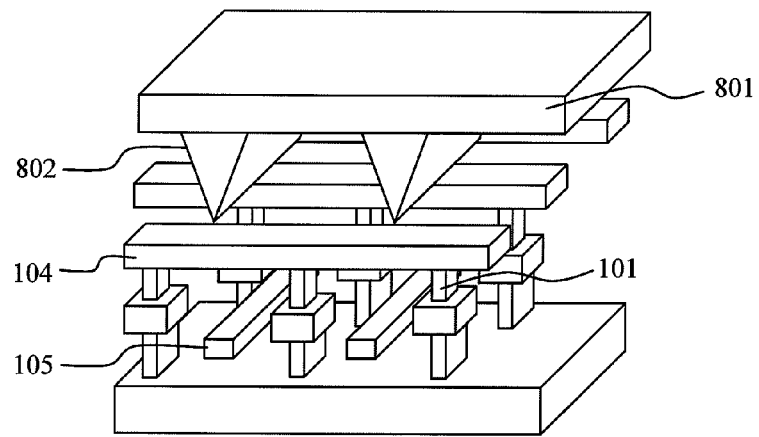
FIG. 8B is a perspective view showing one example of MRAM according to the present invention.

The ferromagnetic layer that generates the effective magnetic field $H_{ex}$ is provided above the magnetic memory cell and may comprise a structure that uniformly generates the magnetic field. FIG. 8A is a cross-sectional schematic diagram of another embodiment of MRAM according to the present invention, and FIG. 8B is the perspective view thereof.

As shown in FIG. 8A, the ferromagnetic layer 801 is provided on the interlayer insulating layer laminated above the sub array, and in the part below the ferromagnetic layer 801, a local magnetic field generation mechanism 802 having downwardly convex-shape is provided at a same pitch as the magnetoresistance effect element 101 in parallel with the word lines 105.

The following explains the case where the magnetization 803 of the ferromagnetic layer 801 is magnetized in the direction of the arrow in FIG. 8A. According to this structure, the magnetic flux 804 is generated from the end part of the local magnetic field generation mechanism 802 similarly to the physical phenomenon called an orange peel effect, and the magnetic field is applied in the direction indicated by the dashed line arrow in FIG. 8A. The magnitude of the magnetic field is adjusted to be effective magnetic field $H_{ex}$ at the position of the recording layer of the magnetoresistance effect element. Where the structure is adopted, it is possible to control the magnetic field strength, uniformity or the like according to the shape of the local magnetic field generation mechanism 802. Therefore, manufacturing becomes easier than MRAM described in embodiment 1 and embodiment 2. In MRAM according to the present embodiment, the direction of the magnetization 803 of the ferromagnetic layer 801 needs to be an inverse direction of the magnetization direction of the pinned layer 106. Therefore, the anisotropy magnetic field of the pinned layer 106, the recording layer 107 and ferromagnetic layer 801 are designed so that the magnitude of the anisotropy magnetic field is different in the relation of the ferromagnetic layer 801>the pinned layer>the recording layer. Further, although the case where the magnetization 803 of the ferromagnetic layer 801 is magnetized in the direction indicated by the arrow in FIG. 8A has been described, the direction of the magnetization 803 of the ferromagnetic layer 801 is not limited if only conditions that the direction is the magnetic easy axes direction of the magnetoresistance effect element and is in an inverse direction of the magnetization of the pinned layer 106 are satisfied.

Figure 9:
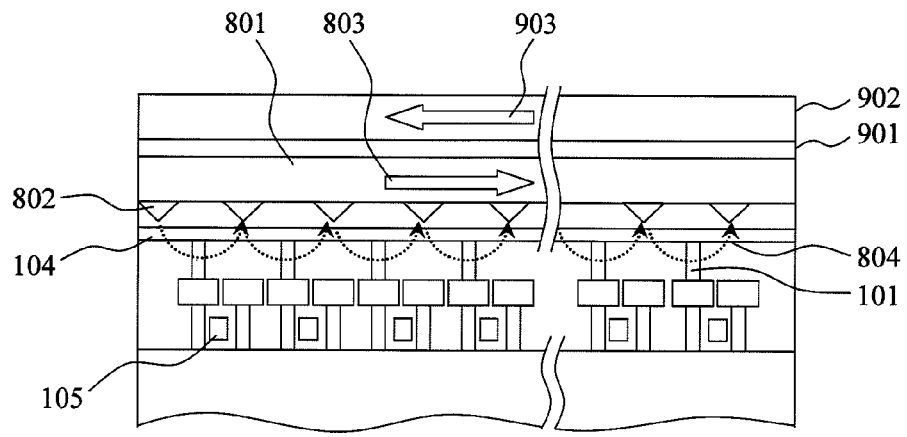
FIG. 9 is a cross-sectional schematic diagram showing one example of MRAM according to the present invention.

Further, it is possible to employ a structure in which, as shown in FIG. 9, a nonmagnetic layer 901 and a ferromagnetic layer 902 may be laminated on the ferromagnetic layer 801 in this order. Where this structure is adopted, the directions of the magnetization 803 of the ferromagnetic layer 801 and the magnetization 903 of the ferromagnetic layer 902 are antiparallelly coupled via the nonmagnetic layer 901. This is a so-called synthetic ferrimagnetic structure. By adopting this structure, it is possible to absorb in the ferromagnetic layer 902 the magnetic flux generated from the end part of ferromagnetic layer 801, and more uniformly retain the magnetic field applied to the magnetoresistance effect element 101. Accordingly, it is desirable that the amount of magnetization of the ferromagnetic layer 801 and ferromagnetic layer 902 become equal.

<Embodiment 4>

Figure 10:
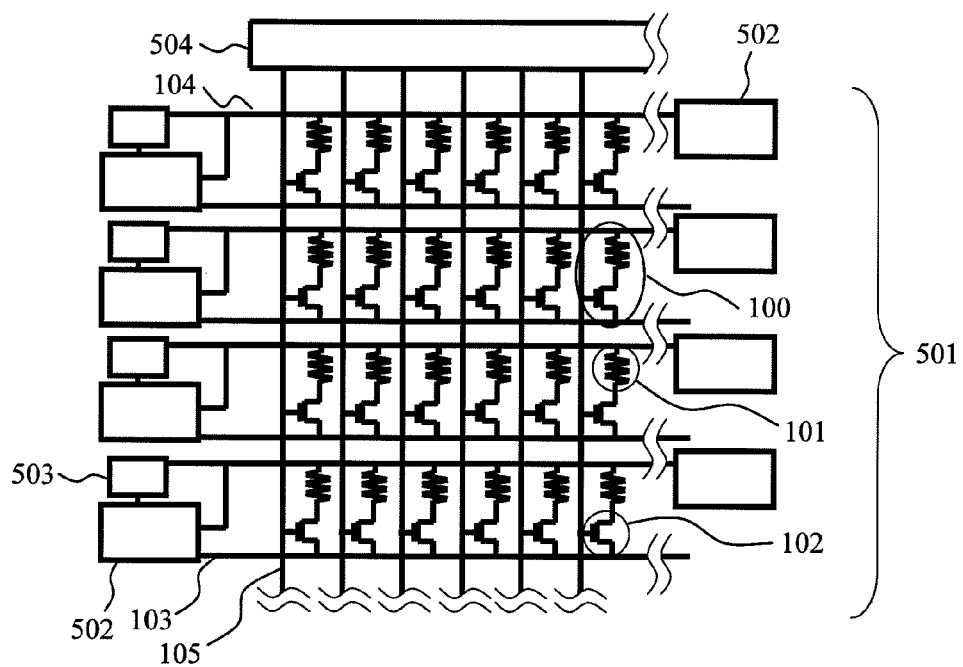
FIG. 10 is a schematic diagram showing one example of MRAM according to the present invention.

FIG. 10 is a schematic diagram showing another embodiment of MRAM according to the present invention. In the present embodiment, the effective magnetic field $H_{ex}$ is applied by a current magnetic field generated by flowing a current through the bit lines. MRAM according to the present embodiment, in order to control the effective magnetic field $H_{ex}$ by the magnitude of the current flowing through the bit lines 104, comprises a mechanism (writing driver 502) to control the voltage across the bit lines at one end or both ends of the bit lines 104.

Hereinafter, a case will be explained where the writing driver 502 is provided on both ends of the bit lines 104. The case where bit information "1" is written will be explained. Where voltage is applied across both ends of one bit line 104 by the writing driver 502 and voltage is applied to the word lines 105, a current flows from the bit lines 104 to the source lines 103 via the magnetoresistance effect element 101 of the magnetic memory cell 100 and the selection transistor 102 located at the points of intersection. In this time, where the electric potentials of the writing drivers 502 located on both ends of the bit lines 104 are different from one another, a current flows from the one end of the bit lines 104 to the other end. A magnetic field is generated at the position of the magnetoresistance effect element 101 by the current. However, the magnitude of the magnetic field needs to be an effective magnetic field $H_{ex}$ at the position of the recording layer of the magnetic memory cell. Therefore, the voltage of the writing driver at both ends of the bit lines 104 is controlled in consideration of the resistance value or the like of the magnetoresistance effect element 101 and the selection transistor 102 so that the effective magnetic field $H_{ex}$ is generated at the position of the recording layer of the magnetoresistance effect element 101.

Further, a same effect can be obtained by a magnetic memory cell of a substantially same configuration with any wiring if only the magnetic field is from the wiring in parallel with bit lines 104.

<Embodiment 5>

Figure 11:
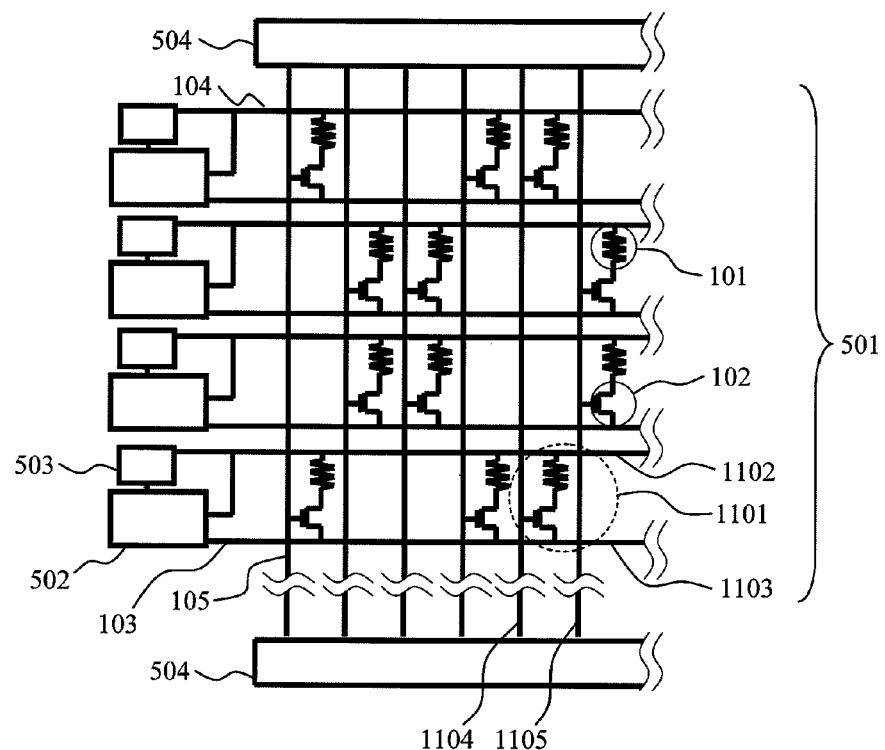
FIG. 11 is a schematic diagram showing one example MRAM according to the present invention.

FIG. 11 is a schematic diagram showing another embodiment of MRAM according to the present invention. In the present embodiment, the effective magnetic field $H_{ex}$ is applied to the recording layer of the magnetic memory cell by a current magnetic field generated by flowing the current through the word lines 105.

In FIG. 11, a configuration is adopted in which the magnetoresistance effect element 101 is not provided for all points of intersection of the bit lines 104 and the word lines 105, and in the case where the magnetoresistance effect element 101 is present on one point of intersection of one bit line 104 and one word line 105, there exists a magnetoresistance effect element at either one of the two points of intersection sharing a bit line 104 of the adjoining points of intersection and there is no magnetoresistance effect element on the other point of intersection (so-called two intersections configuration). Further, the configuration is adopted so that the word driver 504 that adjusts the voltage is provided at both ends of the word lines 105, and the desired current can be flown to the word lines 105.

Regarding a writing scheme of MRAM according to the present embodiment, a case where bit information "1" is written will be explained by using FIG. 11. Where bit information is written in the magnetic memory cell 1101 that is encircled by the dashed line of a plurality of magnetic memory cells in FIG. 11, the voltage of the bit line 1102 of the plurality of bit lines 104 is 0, and a voltage of $V_w$ is applied to the source line 1103 of the plurality of the source lines 103. In this state, where the voltage $V_g$ is applied to one end of a word line 1104 of the plurality of word lines 105, a current flows from the source line 1103 to the bit line 1102. Here, when a predetermined voltage $V_1$ is applied to one of the ends of the word line of the word line 1105, and a voltage $V_2$ is applied to the other end of the word line, a current $I_{word}=(V_1-V_2)/R_{word}$ according to the word line resistance $R_{word}$ flows. $I_{word}$ generates the magnetic field $H=I_{word}/2\pi r$ (r is distance from the word line 1105) around the word line 1105. The magnitude of the magnetic field is controlled to be the effective magnetic field $H_{ex}$ at a position of the recording layer of the magnetic memory cell 1101. It is possible to perform this control by adjusting the magnitude of $V_1$ and $V_2$, magnitude of $R_{word}$ according to the length of the word line and the material thereof. Since there is no magnetoresistance effect element at the point of intersection of the bit line 1102 and the word line 1105, the magnetic memory cell in which the bit information is to be written is only the magnetic memory cell 1101 existing on the point of intersection of the bit line 1102 and the word line 1104, and it is possible to prevent write errors. In the case where the magnetic field is applied in this configuration, it is not necessary to newly add a ferromagnetic layer, and it becomes possible to simplify the preparation process.

Figure 12:
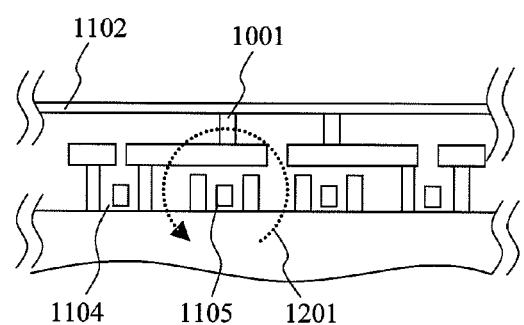
FIG. 12 is a cross-sectional diagram of the magnetic memory cell.

Further, as shown in the cross-sectional schematic diagram in FIG. 12, the magnetoresistance effect element 1001 of the magnetic memory cell 1101 provided at the point of intersection of the bit line 1102 and the word line 1104 may be prepared immediately above the word line 1105. In this case, the distance between the word line 1105 and the magnetoresistance effect element 1001 becomes close, and it becomes easy to apply a large magnetic field. Further, since the magnetic flux 1201 is generated as indicated by the dotted line arrow 1201 of FIG. 12, there is a benefit that uniform magnetic field can be applied to the magnetoresistance effect element 1001.

Further, a same effect can be obtained by a magnetic memory cell of a substantially same configuration with any wiring if only the magnetic field is from the wiring in parallel with word lines 105.

<Embodiment 6>

Figure 13:
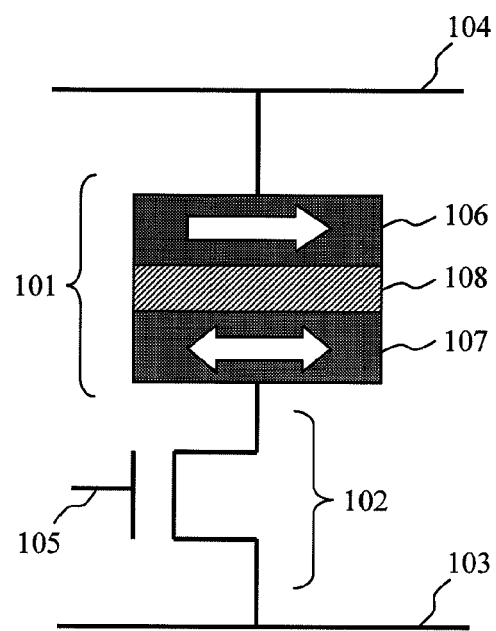
FIG. 13 is a conceptual diagram showing another example of the magnetic memory cell.

Regarding MRAM described in embodiments 1 to 5, the positional relation of the pinned layer and the recording layer of the magnetoresistance effect element 101 may be a so-called top pin structure in which the pinned layer 106 is positioned on the side of the bit lines 104, and the recording layer 107 is positioned on the side of the selection transistor 102, as shown in FIG. 13.

Figure 4A:
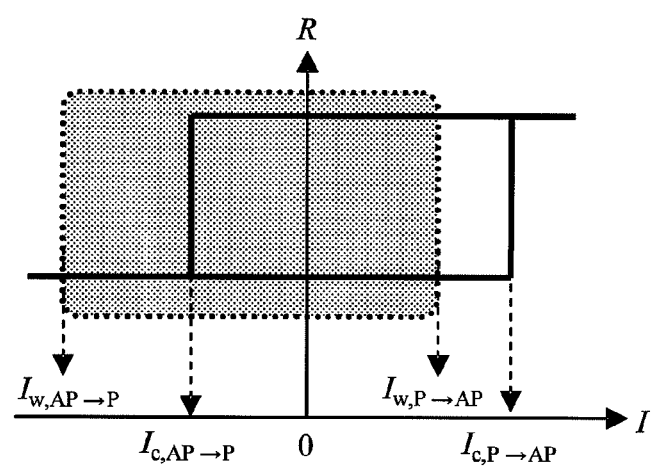
FIG. 4A is a conceptual diagram showing the relation of threshold magnetization switching current of the recording layer of the magnetoresistance effect element and a drive current of the selection transistor.
Figure 4B:
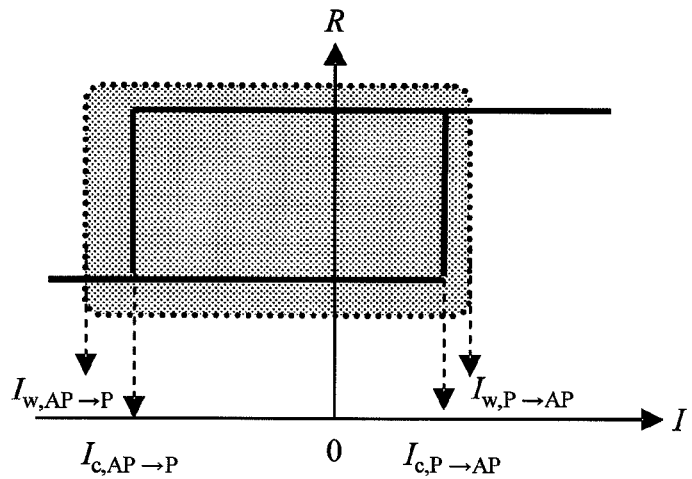
FIG. 4B is a conceptual diagram showing the relation of threshold magnetization switching current of the recording layer of the magnetoresistance effect element and a drive current of the selection transistor.
Figure 4C:
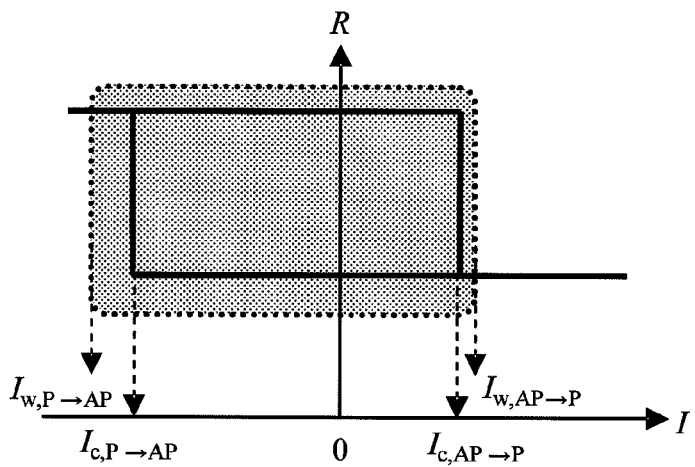
FIG. 4C is conceptual diagram showing the relation of threshold magnetization switching current of the recording layer of the magnetoresistance effect element and a drive current of the selection transistor.
Figure 4D:
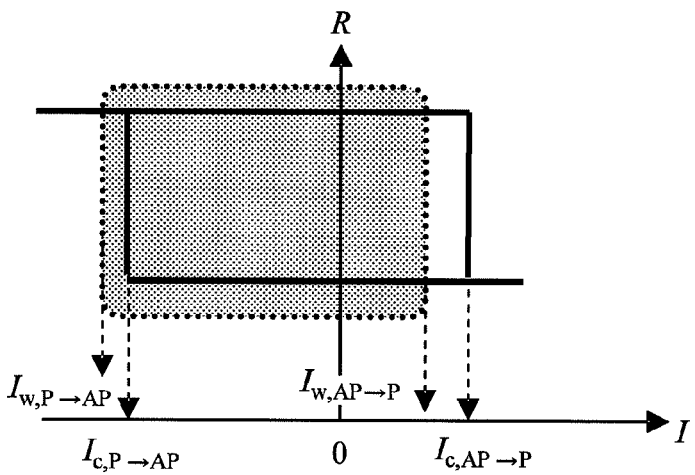
FIG. 4D is a conceptual diagram showing the relation of threshold magnetization switching current of the recording layer of the magnetoresistance effect element and a drive current of the selection transistor.

In the case where the configuration is applied, "0" writing flows the current in the direction from the source lines 103 to the bit lines 104, and "1" writing flows the current in the direction from the bit lines 104 to the source lines 103. Therefore, the polarities of $I_{c,P \to AP}$ and $I_{c,AP \to P}$ become inverse to one another, and the relation of the threshold magnetization switching current of the magnetoresistance effect element and the drive current of the selection transistor become as shown in FIG. 4C. Accordingly, a case can be considered where the conditions of $I_{w,AP \to P} > I_{c,AP \to P}$, $I_{w,P \to AP} > I_{c,P \to AP}$ are satisfied without applying the effective magnetic field $H_{ex}$ to the magnetoresistance effect element. However, also in this case, since there are cases where conditions of $I_{w,AP \to P} > I_{c,AP \to P}$, $I_{w,P \to AP} > I_{c,P \to AP}$ are not satisfied as shown in FIG. 4D, depending on the conditions including the size of the magnetoresistance effect element 101 and the size of the selection transistor 102, magnetic field application works effectively for writing bit information. With the top pin structure as in the magnetoresistance effect element 101 of the present embodiment, the effective magnetic field $H_{ex}$ becomes substantially small as compared to so-called bottom pin structure.

<Embodiment 7>

Figure 14A:
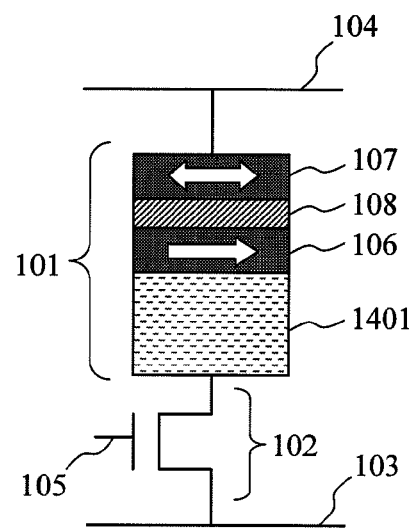
FIG. 14A is a conceptual diagram showing another example of the magnetic memory cell.
Figure 14B:
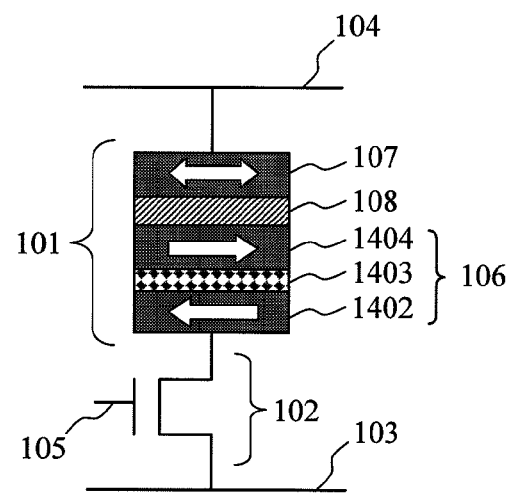
FIG. 14B is a conceptual diagram showing another example of the magnetic memory cell.
Figure 14C:
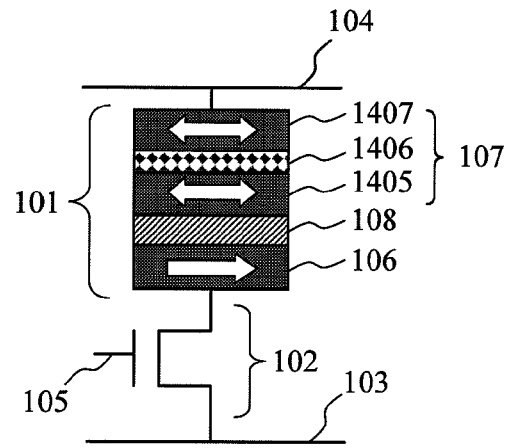
FIG. 14C is a conceptual diagram showing another example of the magnetic memory cell.

FIGS. 14A to 14C are conceptual diagrams showing other examples of the magnetic memory cell. With regard to the magnetoresistance effect element 101 of the magnetic memory cell in MRAM explained in embodiments 1 to 6, inverse ferromagnetic layers 1401 may be applied to the surface on the opposite side of the nonmagnetic layer 108 of the pinned layer 106 as shown in FIG. 14A. In this case, magnetization of the pinned layer 106 is strongly pinned by the inverse ferromagnetic layer 1401. FIG. 14A shows an application to the magnetoresistance effect element of the bottom pin structure, in which case the inverse ferromagnetic layer 1401 is applied to a side end face of the selection transistor 102 of the pinned layer 106.

Further, in the case of bottom pin structure as shown in FIG. 14B, the pinned layer 106 of the magnetoresistance effect element 101 may be structured so that the ferromagnetic layer 1402, nonmagnetic layer 1403 and the ferromagnetic layer 1404 are laminated in this order. The magnetization of the ferromagnetic layer 1404 and the magnetization of the ferromagnetic layer 1402 are coupled so as to be in antiparallel with each other via a nonmagnetic layer 1403. This is so-called a synthetic ferrimagnetic structure. By adopting the synthetic ferrimagnetic structure, it is possible to decrease fringing field from the pinned layer. Further, the inverse ferromagnetic layer may be disposed under the ferromagnetic layer 1402.

Further, FIG. 14C shows an example of magnetic memory cell of the bottom pin structure, and it may be structured so that a ferromagnetic layer 1405, a nonmagnetic layer 1406, and a ferromagnetic layer 1407 are laminated in this order, to serve as the recording layer 107 of the magnetoresistance effect element 101. The magnetization of the ferromagnetic layer 1405 and the magnetization of the ferromagnetic layer 1407 are coupled so as to be in antiparallel with each other via the nonmagnetic layer 1406. This is so-called synthetic ferrimagnetic structure. By adopting the synthetic ferrimagnetic structure for the recording layer, it is possible to increase the anisotropy magnetic field $H_k$ of the recording layer. FIG. 14B and FIG. 14C may be combined so that both pinned layer and recording layer have the synthetic ferrimagnetic structure.

In the magnetoresistance effect element of the top pin structure as shown in FIG. 13, it is possible to employ the synthetic ferrimagnetic structure for one or both of the pinned layer and the recording layer. Further, with the top pin structure, since the ferromagnetic layer in the side of the bit line serves as the pinned layer, the inverse ferromagnetic layer is applied to the bit-line-side end face of the pinned layer.

<Embodiment 8>

As means for applying the effective magnetic field $H_{ex}$ to the recording layer of the magnetoresistance effect element, it is possible to employ magnetic coupling by controlling film configuration of the magnetoresistance effect element and leakage magnetic field from the pinned layer, etc. The magnetoresistance effect element undergoes magnetization switching by being applied with the current and transitions between the P state and AP state, but, it also transitions by an external magnetic field similarly.

Figure 15A:
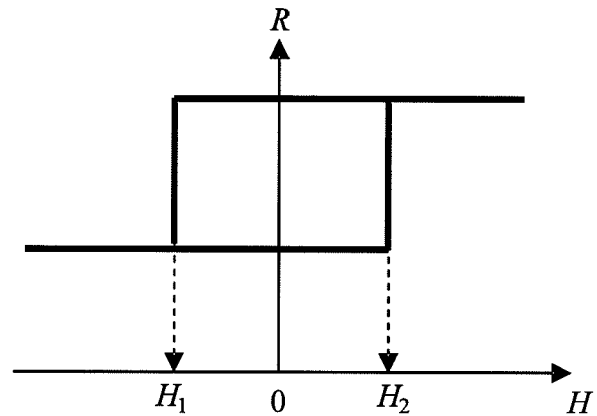
FIG. 15A is a diagram showing a change of resistance of the magnetoresistance effect element against an external magnetic field.
Figure 15B:
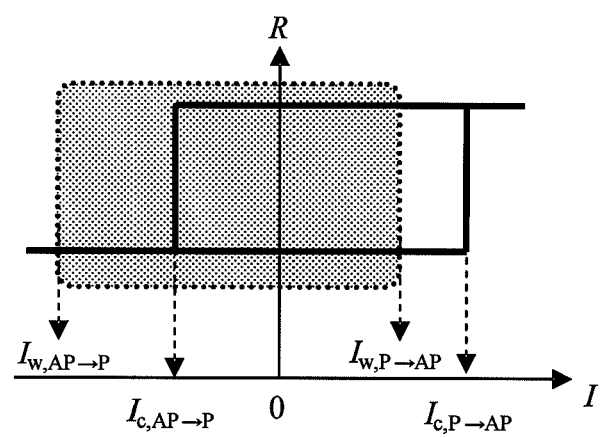
FIG. 15B is a conceptual diagram showing the relation of threshold magnetization switching current of the recording layer of the magnetoresistance effect element and a drive current of the selection transistor.

FIG. 15A shows a change of resistance of the magnetoresistance effect element against an external magnetic field. As shown in FIG. 15A, when the relation between the magnetic field $H_1$ and $H_2$ showing change of resistance is $|H_1|=|H_2|$, the magnetoresistance effect element shows the relation of $I_{c,P \to AP} > I_{c,AP \to P}$ as in FIG. 15B (same state as in FIG. 4A). However, when the change of resistance against an external magnetic field of the magnetoresistance effect element is in the relation of $|H_1|=|H_2|$ as shown in FIG. 15C, the change of resistance against the current of the magnetoresistance effect element may be the state as shown in FIG. 15D showing the relation of $I_{c,P \to AP} < I_{c,AP \to P}$.

Figure 15C:
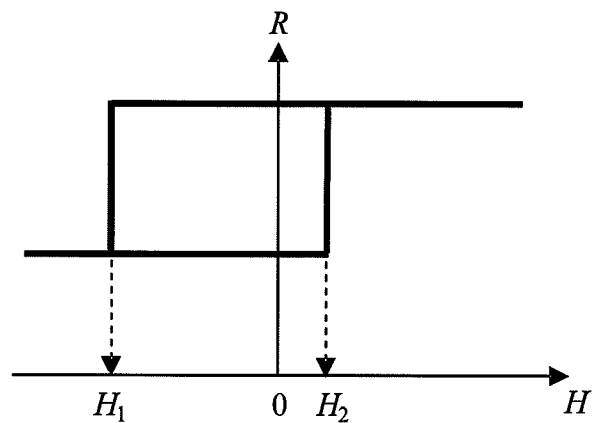
FIG. 15C is a diagram showing a change of resistance of the magnetoresistance effect element against an external magnetic field.
Figure 15D:
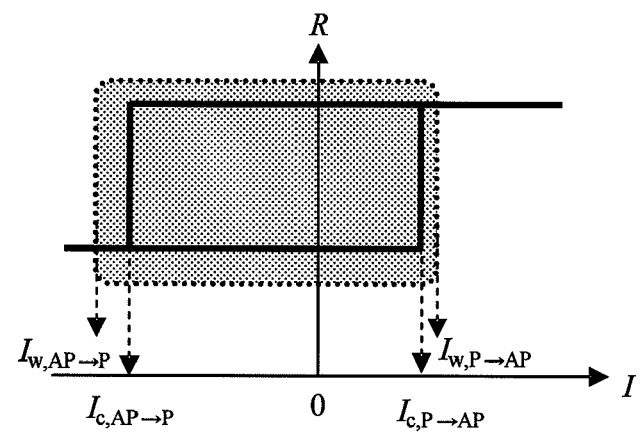
FIG. 15D is a conceptual diagram showing the relation of threshold magnetization switching current of the recording layer of the magnetoresistance effect element and a drive current of the selection transistor.

In order to achieve the state of the magnetoresistance effect element as shown in FIG. 15C and FIG. 15D, it is necessary to control magnetic coupling and the leakage magnetic field. An explanation is given of the magnetic memory cell of the embodiment 8 with the magnetoresistance effect element 101 shown in FIG. 1 as an example. The leakage magnetic field from the pinned layer 106 can be controlled by changing the thickness of the pinned layer 106. Further, the magnetic coupling of the pinned layer 106 and the recording layer 107 can be controlled by changing the thickness of the nonmagnetic layer 108. By appropriately controlling these, it becomes possible to set the effective magnitude of the magnetic field applied to the recording layer 107 to be $H_{ex}$.

Further, also the magnetoresistance effect element of the top pin structure of the embodiment 6 as shown in FIG. 13, similarly, it is possible to control the effective magnitude of the magnetic field applied to the recording layer by changing the thickness of the pinned layer and nonmagnetic layer. Further, in the case of the magnetoresistance effect element of embodiment 7, it is possible to control the magnitude of the magnetic field with high accuracy by controlling the thickness of the synthetic ferrimagnetic structure.

<Embodiment 9>

Figure 16:
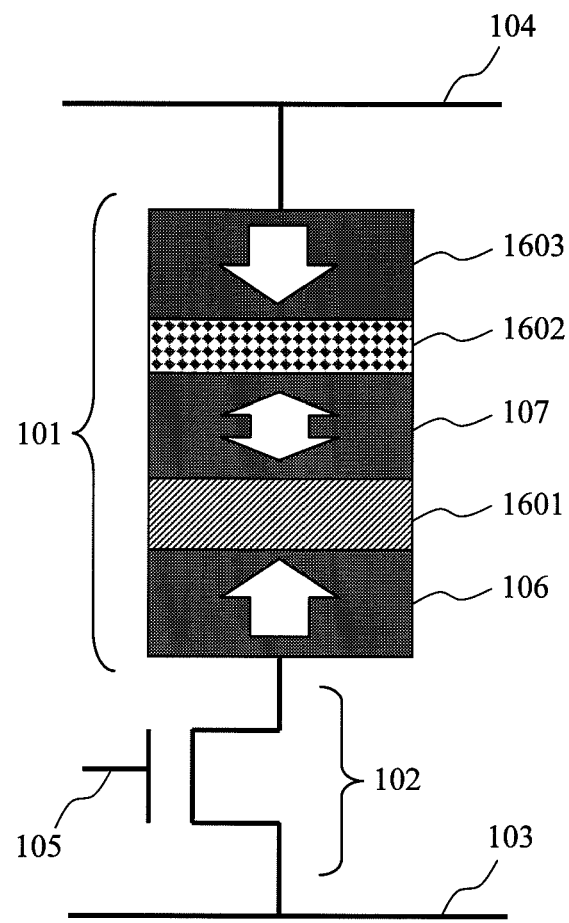
FIG. 16 is a schematic representation showing another embodiment of the magnetic memory cell of MRAM according to the present invention.

FIG. 16 is a schematic representation showing a magnetic memory cell of MRAM according to another embodiment of the present invention. The present embodiment is an example in which the pinned layer 106 and the recording layer 107 of the magnetoresistance effect element 101 constituting the magnetic memory cell is prepared of a ferromagnetic material having a perpendicular magnetic anisotropy.

In the case where the magnetoresistance effect element 101 is prepared of a material having a perpendicular magnetic anisotropy, as described above, it is necessary to reduce $I_{c,P \to AP}$ to be smaller than the case where the magnetoresistance effect element 101 is prepared of a ferromagnetic material having in-plane magnetic anisotropy. The magnetic memory cell of the present embodiment has a structure in which the pinned layer 106, the insulating layer 1601, the recording layer 107, the nonmagnetic layer 1602 and the ferromagnetic layer 1603 are laminated in this order. The direction of the magnetization of the pinned layer 106 and the direction of the magnetization of the ferromagnetic layer 1603 are pinned to be in antiparallel with each other. Accordingly, the magnitude of the anisotropy magnetic field $H_k$ of the pinned layer 106 and the ferromagnetic layer 1603 are designed to be different, so that the layers may be magnetized to be in antiparallel with each other. Further, the magnitude $H_A$ of the magnetic field applied from the ferromagnetic layer 1603 to the recording layer $\omega$ is designed to be larger than the magnitude $H_B$ of the magnetic field applied from the pinned layer 106 to the recording layer 107, and so that $H_A - H_B = H_{ex}$. Further, the change of resistance caused by the magnetization disposition of the pinned layer 106 and the recording layer 107 via the insulating layer 1601 is greater than the change of resistance caused by the magnetization disposition of the recording layer 107 and the ferromagnetic layer 1603 via the nonmagnetic layer 1602. Therefore, it is possible to read out a change of resistance caused by the magnetization disposition of the pinned layer 106 and the recording layer 107 via the insulating layer 1601 as bit information.

<Embodiment 10>

Where the pinned layer and the recording layer of the magnetoresistance effect element prepared by a ferromagnetic layer having the perpendicular magnetic anisotropy, the ferromagnetic layer for applying the effective magnetic field $H_{ex}$ to the recording layer may be prepared above the magnetic memory cell.

Figure 17:
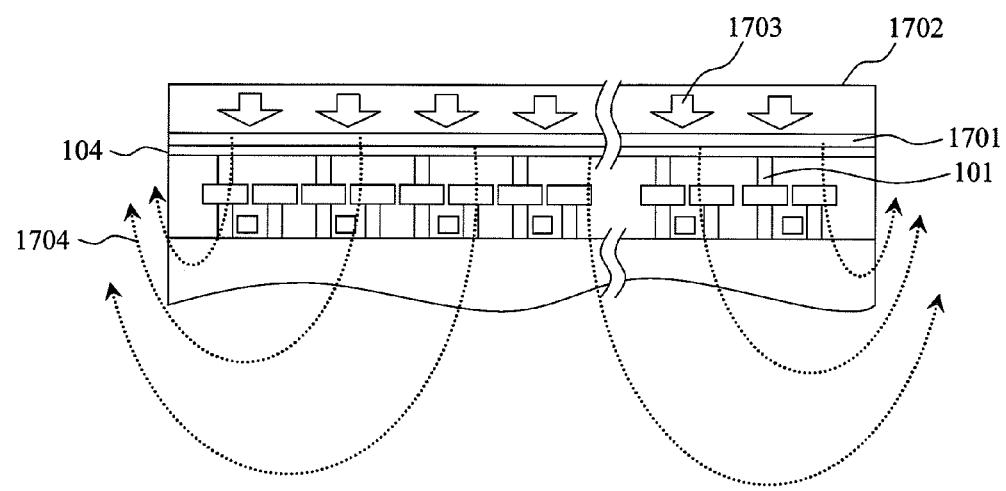
FIG. 17 is a cross-sectional schematic diagram showing one example of MRAM according to the present invention.
Figure 18:
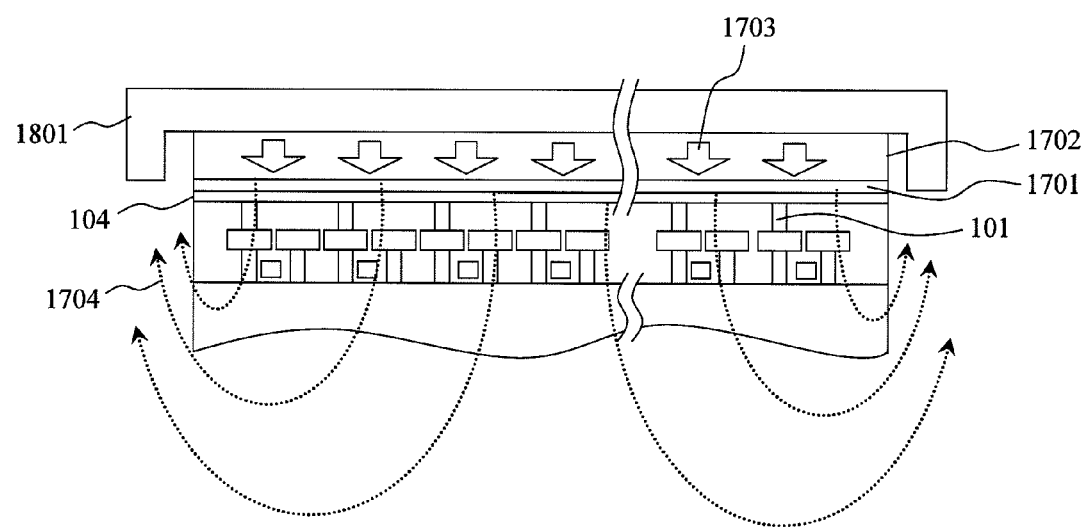
FIG. 18 is a cross-sectional schematic diagram showing one example of MRAM according to the present invention.

FIG. 17 is a cross-sectional schematic diagram of MRAM according to the present embodiment. A ferromagnetic layer 1702 is provided on the interlayer insulating layer 1701 laminated above the sub array. The following explains, the case where the magnetization 1703 of ferromagnetic layer 1702 is magnetized in the direction indicated by the arrow in the Figure. When this structure is adopted, the nonmagnetic layer 1602 and the ferromagnetic layer 1603 of embodiment 9 may not be necessary. A magnetic flux 1704 is generated from the ferromagnetic layer 1702 and the magnetic field is applied in the direction indicated by the dashed line arrow. As shown in FIG. 18, the return yoke 1801 may be provided above the ferromagnetic layer 1702. Where the return yoke 1801 is provided, the magnetic flux 1704 is absorbed in the return yoke, so that the magnetic field is applied uniformly. Further, the magnetism layer into which the magnetic flux is absorbed may be prepared on the back face of the substrate on which MRAM is formed.

The magnitude of the magnetic field is adjusted to be effective magnetic field $H_{ex}$ at the position of the recording layer of the magnetoresistance effect element. In MRAM according to the present embodiment, the direction of the magnetization 1703 of the ferromagnetic layer 1702 needs to be in the inverse direction of the magnetization direction of the pinned layer of the magnetoresistance effect element of the magnetic memory cell. Accordingly, the pinned layer, the recording layer and the anisotropy magnetic field $H_k$ of the ferromagnetic layer 1702 are designed so that the magnitude is different in the relation of the ferromagnetic layer 1702>the pinned layer>the recording layer.

Further, although the case has been described where the magnetization 1703 of the ferromagnetic layer 1702 is magnetized in the direction indicated by the arrow in FIG. 17, the direction of the magnetization 1703 of the ferromagnetic layer 1702 is not limited if only the conditions that the direction is the magnetic easy axes direction of the magnetoresistance effect element and in the inverse direction of the magnetization of the pinned layer are satisfied. Further, the magnitude $H_C$ of the magnetic field generated from the ferromagnetic layer 1702 is designed to be larger than the magnitude $H_B$ of the magnetic field generated from the pinned layer and $H_C - H_B = H_{ex}$.

| Reference Signs List | |
|---|---|
| 100 | magnetic memory cell |
| 101 | magnetoresistance effect element |
| 102 | selection transistor |
| 103 | source line |
| 104 | bit line |
| 105 | word line |
| 106 | pinned layer |
| 107 | recording layer |
| 108 | nonmagnetic layer |
| 501 | sub array |
| 502 | writing driver |
| 503 | sense amplifier |
| 504 | word driver |
| 601 | ferromagnetic layer |
| 602 | ferromagnetic layer |
| 701 | ferromagnetic layer |
| 702 | interlayer insulating layer |
| 801 | ferromagnetic layer |
| 802 | local magnetic field generation mechanism |
| 901 | nonmagnetic layer |
| 902 | ferromagnetic layer |
| 1401 | inverse ferromagnetic layer |
| 1402 | ferromagnetic layer |
| 1403 | nonmagnetic layer |
| 1404 | ferromagnetic layer |
| 1405 | ferromagnetic layer |
| 1406 | nonmagnetic layer |
| 1407 | ferromagnetic layer |
| 1601 | insulating layer |
| 1602 | nonmagnetic layer |
| 1603 | ferromagnetic layer |
| 1701 | interlayer insulating layer |
| 1702 | ferromagnetic layer |
| 1801 | return yoke |

The invention claimed is:

1. A magnetic memory cell comprising:
a magnetoresistance effect element comprising a first ferromagnetic layer; a second ferromagnetic layer; and a nonmagnetic layer formed between the first ferromagnetic layer and the second ferromagnetic layer, wherein one of the first ferromagnetic layer and the second ferromagnetic layer is a pinned layer whose magnetization direction is pinned and the other is a recording layer whose magnetization direction is variable,
a selection transistor; and
a mechanism that applies a voltage in series to the magnetoresistance effect element and the selection transistor, wherein
a drain electrode of the selection transistor is electrically connected with the first ferromagnetic layer;
the magnetoresistance effect element is placed in a first resistance value state when a current exceeding a first threshold current flows from the first ferromagnetic layer to the second ferromagnetic layer, and placed in a second resistance value state when a current exceeding a second threshold current flows from the second ferromagnetic layer to the first ferromagnetic layer; and
a magnetic field application mechanism is provided that applies a magnetic field that is in inverse direction of the magnetization direction of the pinned layer to the recording layer, in accordance with reduction of the drive current of the selection transistor in applying voltage thereto so as to flow a current from the first ferromagnetic layer to the second ferromagnetic layer as compared to that in applying a voltage so as to flow a current from the second ferromagnetic layer to the first ferromagnetic layer and in order to decrease the first threshold current on flowing a current from the first ferromagnetic layer to the second ferromagnetic layer to be equal to or less than the drive current of the selection transistor.

2. The magnetic memory cell according to claim 1, wherein the first ferromagnetic layer is the pinned layer, the second ferromagnetic layer is the recording layer, the first resistance value state is in a high resistance state, the second resistance value state is in a low resistance state, and magnitude of an effective magnetic field $H_{ex}$ applied to the recording layer by the magnetic field application mechanism satisfies following conditions:

$$H_{ex} > H_k \left\{ \left[ \left(1 - \frac{I_{w,P \to AP}}{I_{c0,P \to AP}}\right) \frac{E}{k_B T} \ln\left(\frac{t_p}{t_0}\right) \right]^{\frac{1}{2}} - 1 \right\}$$

and $$H_{ex} < H_k \left\{ 1 - \left[ \left(1 - \frac{I_{w,AP \to P}}{I_{c0,AP \to P}}\right) \frac{E}{k_B T} \ln\left(\frac{t_p}{t_0}\right) \right]^{\frac{1}{2}} \right\}$$

(where $H_k$ is anisotropy magnetic field of the recording layer, $I_{w,AP \to P}$ is the drive current of the selection transistor on flowing a current from the recording layer to the pinned layer, $I_{w,P \to AP}$ is the drive current of the transistor on flowing a current from the pinned layer to the recording layer, $I_{c0,AP \to P}$ is the second threshold current when the writing time is assumed to be 1 ns, $I_{c0,P \to AP}$ is the first threshold current when a writing time is assumed to be 1 ns, E is a potential barrier, $k_B$ is a Boltzmann constant, T is a temperature, $t_p$ is a writing time, and $t_0$ is 1 ns).

3. The magnetic memory cell according to claim 1, wherein the first ferromagnetic layer is the recording layer, the second ferromagnetic layer is the pinned layer, the first resistance value state is a low resistance state, the second resistance value state is a high resistance state, and the magnitude of effective magnetic field $H_{ex}$ applied by the magnetic field application mechanism to the recording layer satisfies the following conditions:

$$H_{ex} > H_k \left\{ \left[ \left(1 - \frac{I_{w,P \to AP}}{I_{c0,P \to AP}}\right) \frac{E}{k_B T} \ln\left(\frac{t_p}{t_0}\right) \right]^{\frac{1}{2}} - 1 \right\}$$

and $$H_{ex} < H_k \left\{ 1 - \left[ \left(1 - \frac{I_{w,AP \to P}}{I_{c0,AP \to P}}\right) \frac{E}{k_B T} \ln\left(\frac{t_p}{t_0}\right) \right]^{\frac{1}{2}} \right\}$$

(where $H_k$ is an anisotropy magnetic field of the recording layer, $I_{w,AP \to P}$ is a drive current of the selection transistor on flowing a current from the recording layer to the pinned layer, $I_{w,P \to AP}$ is the drive current of the transistor on flowing a current from the pinned layer to the recording layer, $I_{c0,AP \to P}$ is the first threshold current when the writing time is assumed to be 1 ns, $I_{c0,P \to AP}$ is the second threshold current when the writing time is assumed to be 1 ns, E is a potential barrier, $k_B$ is Boltzmann constant, T is temperature, $t_p$ is writing time, and $t_0$ is 1 ns).

4. The magnetic memory cell according to claim 1, wherein an inverse ferromagnetic layer is provided on a surface on an opposite side of the nonmagnetic layer of the pinned layer.

5. The magnetic memory cell according to claim 4, wherein the pinned layer comprises a synthetic ferrimagnetic structure in which a nonmagnetic layer is sandwiched between two layers of ferromagnetic layers whose directions of the magnetization are in antiparallel with each other.

6. The magnetic memory cell according to claim 1, wherein the recording layer comprises a synthetic ferrimagnetic structure in which the nonmagnetic layer is sandwiched by two layers of ferromagnetic layers whose directions of magnetization are in antiparallel with each other.

7. The magnetic memory cell according to claim 1, wherein the nonmagnetic layer formed between the first ferromagnetic layer and the second ferromagnetic layer is an insulating layer.

8. The magnetic memory cell according to claim 2, wherein the leakage magnetic field from the pinned layer is applied to the recording layer as the effective magnetic field $H_{ex}$.

9. The magnetic memory cell according to claim 1,
wherein the first ferromagnetic layer and the second ferromagnetic layer have a perpendicular magnetic anisotropy, a nonmagnetic layer formed between the first ferromagnetic layer and the second ferromagnetic layer is an insulating layer, and
a third ferromagnetic layer is laminated on a surface of the opposite side of the insulating layer of the recording layer via the second nonmagnetic layer, and the magnetization of the pinned layer and the magnetization of the third ferromagnetic layer are pinned to be in antiparallel with each other.

10. A magnetic random access memory comprising a sub array comprising:
a plurality of bit lines arranged in parallel with each other;
a plurality of source lines arranged in parallel with the bit lines;
a plurality of word lines crossing the bit lines and arranged in parallel with each other; and
a plurality of magnetic memory cells disposed at a part in which the bit lines and the word lines cross, wherein
the magnetic memory cell is the magnetic memory cell according to claim 1,
the bit lines are electrically connected to the second ferromagnetic layer,
the source lines are electrically connected to the source electrode of the selection transistor, and
the word lines are electrically connected to the gate electrode of the selection transistor.

11. The magnetic random access memory according to claim 10, wherein a pair of ferromagnetic layers are provided which are prepared on a same layer as the magnetoresistance effect element to sandwich the sub array, and the magnetization directions of the pair of ferromagnetic layers are in the inverse direction of the magnetization direction of the pinned layer.

12. The magnetic random access memory according to claim 10, further comprising a third ferromagnetic layer which is formed above the sub array via an interlayer insulating layer and whose magnetization is pinned to be the same magnetization direction of the pinned layer.

13. The magnetic random access memory according to claim 10, further comprising a third ferromagnetic layer which is formed above the sub array via the interlayer insulating layer, and whose magnetization is pinned in the inverse direction of the magnetization of the pinned layer, and the third ferromagnetic layer comprises a concavo-convex shaped local magnetic field generation mechanism provided in parallel with the word lines at a lower part thereof.

14. The magnetic random access memory according to claim 13, further comprising a fourth ferromagnetic layer on the third ferromagnetic layer via the nonmagnetic layer, and the magnetization of the fourth ferromagnetic layer is pinned in inverse direction of the magnetization direction of the third ferromagnetic layer.

15. The magnetic random access memory according to claim 10, wherein the magnetic field application mechanism comprises, at one end or both ends of the bit lines, a mechanism to control a voltage, and when performing writing to a desired magnetic memory cell, applies a magnetic field generated by flowing a current to the bit lines connected to the magnetic memory cell to the desired recording layer of the magnetic memory cell.

16. The magnetic random access memory according to claim 10, wherein the magnetic memory cell is disposed at only one of two points of intersection adjoining the point of intersection and sharing a bit line when the magnetic memory cell is disposed at one point of intersection of the bit lines and the word lines, comprises a mechanism to control a voltage at both ends of the word lines, and, when writing bit information to a selected magnetic memory cell, applies a voltage to a word line that forms a point of intersection in which the selected magnetic memory cell is disposed, and applies a magnetic field generated by flowing a current to a word line that forms a point of intersection in which the magnetic memory cell is not disposed, of two points of intersection sharing the bit line, of the points of intersection adjoining the point of intersection in which the selected magnetic memory cell is disposed.

17. The magnetic random access memory according to claim 10, wherein
the first ferromagnetic layer and the second ferromagnetic layer of the magnetic memory cell have a perpendicular magnetic anisotropy, and the magnetic random access memory comprises a third ferromagnetic layer which is formed above the sub array via an interlayer insulating layer whose magnetization is pinned in antiparallel with the magnetization of the pinned layer.

18. The magnetic random access memory according to claim 17, wherein a return yoke is provided above the third ferromagnetic layer.

19. The magnetic random access memory according to claim 17, wherein a fourth ferromagnetic layer is provided on the back face of the substrate on which the sub array is formed, to absorb a magnetic flux generated from the third ferromagnetic layer.

20. The magnetic memory cell according to claim 3, wherein the leakage magnetic field from the pinned layer is applied to the recording layer as the effective magnetic field $H_{ex}$.

* * * * *